(12) United States Patent
Tsuei

(10) Patent No.: US 8,062,455 B2
(45) Date of Patent: Nov. 22, 2011

(54) COMPOSITION COMPRISING BENZOXAZINE AND EPOXY RESIN

(75) Inventor: Dave Tsuei, Kaohsiung (TW)

(73) Assignee: Huntsman Advanced Materials Americas LLC, The Woodlands, TX (US)

( * ) Notice: Subject to any disclaimer, the term of this patent is extended or adjusted under 35 U.S.C. 154(b) by 769 days.

(21) Appl. No.: 11/910,314

(22) PCT Filed: Mar. 21, 2006

(86) PCT No.: PCT/EP2006/060909
§ 371 (c)(1),
(2), (4) Date: Aug. 14, 2008

(87) PCT Pub. No.: WO2006/103185
PCT Pub. Date: Oct. 5, 2006

(65) Prior Publication Data
US 2008/0302471 A1 Dec. 11, 2008

(30) Foreign Application Priority Data
Apr. 1, 2005 (EP) .................................... 05102604

(51) Int. Cl.
*B32B 27/00* (2006.01)
*C07F 7/00* (2006.01)
*C08K 5/00* (2006.01)
*C08G 65/48* (2006.01)
*C08L 71/12* (2006.01)

(52) U.S. Cl. ...................... 156/242; 524/176; 525/390

(58) Field of Classification Search ................ 156/242; 524/176; 525/390
See application file for complete search history.

(56) References Cited

U.S. PATENT DOCUMENTS

| | | | |
|---|---|---|---|
| 5,019,639 A * | 5/1991 | Hofer et al. | 528/94 |
| 2002/0156189 A1* | 10/2002 | Ogura et al. | 525/107 |
| 2003/0094232 A1* | 5/2003 | Saitou et al. | 156/181 |
| 2003/0152776 A1* | 8/2003 | Kiuchi et al. | 428/413 |
| 2004/0166324 A1* | 8/2004 | Mishima et al. | 428/413 |
| 2004/0261660 A1* | 12/2004 | Li et al. | 106/287.22 |

\* cited by examiner

*Primary Examiner* — Philip Tucker
*Assistant Examiner* — Michael Orlando

(57) ABSTRACT

The instant invention relates to compositions comprising a benzoxazine resin and an advancement resin based on bisphenol A diglycidyl ether and bisphenol S and, optionally, ferrocene and aluminium trihydrate. Such compositions are, when cured to form polymeric networks, difficultly inflammable and resistant to high temperatures. Such compositions may especially be used in the production of printed wiring boards.

8 Claims, No Drawings

COMPOSITION COMPRISING BENZOXAZINE AND EPOXY RESIN

CROSS REFERENCE TO RELATED APPLICATIONS

This application is the National Phase of International Application PCT/EP2006/060909 filed Mar. 21, 2006 which designated the U.S. and which claims priority to European Patent Application (EP) 05102604.5 filed Apr. 1, 2005. The noted applications are incorporated herein by reference.

TECHNICAL FIELD

The invention relates to a composition comprising a benzoxazine resin and an advancement resin based on bisphenol A diglycidyl ether and bisphenol S and, optionally, ferrocene and aluminium trihydrate. Such composition may be cured to form polymeric networks which are flame retardant and resistant to high temperatures.

BACKGROUND OF THE INVENTION

FR-4 PCB Laminate is the most commonly used base material for printed circuit boards. The "FR" means Flame Retardant (to UL94V-0), and Type "4" indicates woven glass reinforced epoxy comprising resin. In addition, the FR-4 Laminate has to pass solder bath tests. In order to make resins flame retardant the addition of bromine, phosphorous, chlorine containing compounds, fillers or the use of special flame retardant backbones is necessary. However, such solutions to make a composition flame retardant based in particular on bromine or phosphorous compounds have as a rule one or several drawbacks:

- They are not soluble in solvents and hence cause problems in terms of processing.
- They show poor oxidative stabilities at elevated temperatures.
- Additives are very often responsible for a decrease of the glass transition levels.
- Very often poor physical properties (for example delaminations) of the cured resins are been observed, especially when phosphorous compounds are present.
- Toxic gases of combustion may form in case of fire, especially when halogenated compounds are present.

An alternative, albeit not entirely satisfactory, approach is disclosed in JP 2001-220455, where prepregs and laminates free from halogen and phosphorus compounds are described as having good characteristics with regard to burning resistance, heat resistance and electrical properties. The composition comprises a phenol compound (for example, bisphenol F, phenol novolac or cresol phenol novolac), secondly, an epoxidized phenol compound of the phenol compound mentioned, thirdly, a dihydrobenzoxazine (for example, having a phenol novolac or a cresol novolac backbone) and, finally, an inorganic flame retardant (for example, aluminium hydroxide, magnesium hydroxide, molybdenum oxide, molybdic acid zinc, boric acid zinc or mixtures thereof).

Thus, there is still an unmet need for improved compositions suitable, in particular, for use in FR-4 Laminate.

SUMMARY OF THE INVENTION

It now has surprisingly been found that articles made from a composition comprising a benzoxazine resin and an advancement resin based on bisphenol A diglycidyl ether and bisphenol S and optionally comprising ferrocene and aluminium trihydrate, show a greatly reduced flammability while the mechanical properties are maintained. A composition comprising a benzoxazine resin and an advancement resin based on bisphenol A diglycidyl ether and bisphenol S offers the further advantage of favorable curing conditions resulting in a shorter press cycle and lower press temperature compared to compositions not containing said advancement resin. Such compositions are therefore particularly suitable for use in aerospace, industrial, electronics or other applications such as PWB, copper clad laminates, prepregs, laminates for liquid dielectric layers, as coating of metal foils, preferably on copper, RCC and casting system. They can also be processed by using infusion techniques such as RTM or VaRTM.

In particular, the present invention makes it possible to prepare laminates and copper clad laminates with low dielectrical properties in terms of permittivity and loss factor combined with flame retardant properties. A laminate based on said composition meets the classification of V0 of the UL-94 standard.

DETAILED DESCRIPTION OF THE INVENTION

A first aspect of the present invention is a composition comprising
  a) a benzoxazine resin and
  b) an advancement resin based on bisphenol A diglycidyl ether and bisphenol S.

Component a): Benzoxazine compounds suitable for carrying out the present invention are compounds containing the structural unit (I)

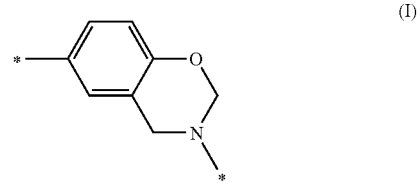

(I)

whereby the asterisk signifies the attachment point to the rest of the molecule. Such benzoxazines can be produced in several ways. First of all, by using a process based on solvents cf. U.S. Pat. No. 5,152,993 or U.S. Pat. No. 5,266,695. Secondly, as for example described in U.S. Pat. No. 5,543,516, the preparation of benzoxazines is disclosed without using solvents.

A particularly preferred class of benzoxazines is obtained by reacting a phenol-type compound and an primary amine-type compound in the presence of formaldehyde. Examples of phenol-type compounds include phenol, bisphenol-A, bisphenol-F, bisphenol-E, bisphenol-S, 1,1,2,2-tetraphenolethan, dicyclopentadienyidiphenol and phenolphthalein; bisphenol-F being most preferred. Examples of primary amine-type compounds include aromatic mono- or di-amines, aliphatic amines, cycloaliphatic amines and heterocyclic monoamines; specifically, aniline, o-, m- and p-phenylene diamine, benzidine, 4,4'-diaminodiphenyl methane, cyclohexylamine, 1,4-diaminocyclohexyl, butylamine, methylamine, hexylamine, allylamine, furfurylamine ethylenediamine, propylenediamine and diaminodiphenylsulfone; aniline being most preferred.

Further particularly preferred benzoxazine are compounds of the general formula

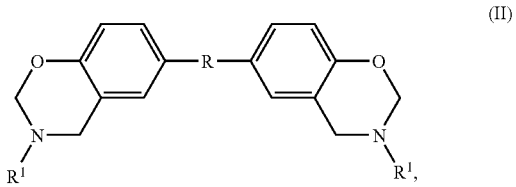

wherein R is —SO$_2$—, —S—, —CH$_2$—, —C(CH$_3$)$_2$—, a bond, dicyclopentadienyidiphenol, phenolphthalein or —CH(CH$_3$)—; and R$^1$ is phenyl or C$_1$-C$_{10}$-alkyl.

Typically, the composition will contain 55 to 65% by weight, preferably 60% by weight, of the benzoxazine.

Component b): The advancement resin based on a diglycidylether of bisphenol-A and 4,4'-dihydroxydiphenyl sulfone may be prepared in analogy to the procedure as described in EP 0077758. A preferred bisphenol-A epoxy resin has an epoxy equivalent of 5 to 6 eq/kg. A preferred advancement resin has an epoxy equivalent of 1.5 to 2.5 Eq/kg. Typically, the composition will contain 35 to 45% by weight, preferably 40% by weight, of the advancement resin.

Another aspect of the present invention is a composition comprising
a) a benzoxazine resin,
b) an advancement resin based on bisphenol A diglycidyl ether and bisphenol S.
c) ferrocene,
d) aluminium trihydrate and
e) optionally a solvent.

Typically, the composition will contain 35 to 42% by weight, preferably 40.85% by weight, of the benzoxazine resin, based on the sum of components a), b), c) and e).

Typically, the composition will contain 23 to 30% by weight, preferably 27% by weight, of the advancement resin, based on the sum of components a), b), c) and e).

Component c): Ferrocene may be used as commercially available, for example, from Jiaxing Fine Chemical LTD, China. Typically, the composition will contain 1.8 to 2.3% by weight, preferably 2.15% by weight, of ferrocene, based on the sum of components a), b), c) and e).

Component d): Aluminium trihydrate may be used as commercially available, for example, from Showa Denko Corp. Japan. Typically, the composition will contain 20 to 45% by weight, preferably 27% by weight, of aluminium trihydrate based on the sum of components a), b), c), d) and e).

Component e): Examples of solvents that are particularly suitable include methylethylketone, acetone, N-methyl-2-pyrrolidone, N,N-dimethyl formamide, pentanol, butanol, dioxolane, isopropanol, methoxy propanol, methoxy propanol acetate, dimethylformamide, glycols, glycol acetates and toluene, xylene. The ketones and the glycols are especially preferred. Typically, the composition will contain 25 to 35% by weight, preferably 30% by weight, of a solvent based on the sum of components a), b), c) and e).

Typically, a catalyst will be added to the composition prior to use. A suitable catalyst is 2-methylimidazol. The catalyst concentration will also depend on the effectiveness of that component in achieving the desired reactivity. Typically, the composition will contain 0.02 to 0.1% by weight of a catalyst, based on the sum of components a), b), c) and d).

By thermally curing said compositions at temperatures above 100° C., preferably at a temperature from 140° to 220° C., difficultly inflammable (flame retardant) polymeric resins are obtained.

Another aspect of the present invention is the use of a benzoxazine compound, as described before, in the process of preparation of flame retarded castings, prepregs or laminates and infusion systems as well.

Flame retardant in the context of the present invention means, preferably, meeting the UL 94 standard ("Underwriters Laboratory" test method UL 94) criterion V0.

The properties of the polymeric resins produced as described above can be tailored for certain applications by addition of usual additives. The following additives are of particular importance:

reinforcement fibers, such as glass, quartz, carbon, mineral and synthetic fibers (Keflar, Nomex), natural fibres, such as (flax, jute, sisal, hemp) in the usual forms of short fibers, staple fibers, threads, fabrics or mats;

plasticizers;
fillers;
dyestuffs;
micro hollow spheres;
metal powders.

The processes known for thermosetting resins, such as phenol formaldehyde resins or epoxy resins, such as hot-pressing of prepregs, SMC (Sheet Molding Compound),); or molding; casting; filament winding; infusion techniques or vacuum impregnating (RTM, VaRTM) are suitable for processing the resins according to the invention. With respect to vacuum impregnating, very fine additives having a particle size of 0.2 to 0.001 mm are particularly suitable.

The composition is useful to make electrical laminates and other composites from fibrous reinforcement and a matrix resin. Examples of suitable processes usually contain the following steps:

Solvent Based Impregnation Process (1) A benzoxazine-containing formulation is applied to or impregnated into a substrate by rolling, dipping, spraying, other known techniques and/or combinations thereof. The substrate is typically a woven or nonwoven fiber mat containing, for instance, glass fibers or paper.

(2) The impregnated substrate is "B-staged" by heating at a temperature sufficient to draw off solvent in the benzoxazine formulation and optionally to partially cure the benzoxazine formulation, so that the impregnated substrate can be handled easily. The "B-staging" step is usually carried out at a temperature of from 90° C. to 210° C. and for a time of from 1 minute to 15 minutes. The impregnated substrate that results from "B-staging" is called a "prepreg". The temperature is most commonly 100° C. for composites and 130° C. to 200° C. for electrical laminates.

(3) One or more sheets of prepreg are stacked or laid up in alternating layers with one or more sheets of a conductive material, such as copper foil, if an electrical laminate is desired.

(4) The laid-up sheets are pressed at high temperature and pressure for a time sufficient to cure the resin and form a laminate. The temperature of this lamination step is usually between 100° C. and 230° C., and is most often between 165° C. and 190° C. The lamination step may also be carried out in two or more stages, such as a first stage between 100° C. and 150° C. and a second stage at between 165° C. and 190° C. The pressure is usually between 50 N/cm$^2$ and 500 N/cm$^2$. The lamination step is usually carried out for a time of from 1 minute to 200 minutes, and most often for 45 minutes to 90 minutes. The lamination step may optionally be carried out at higher temperatures for shorter times (such as in continuous lamination processes) or for longer times at lower temperatures (such as in low energy press processes).

(5) Optionally, the resulting laminate, for example, a copper-clad laminate, may be post-treated by heating for a time at high temperature and ambient pressure. The temperature of post-treatment is usually between 120° C. and 250° C. The post-treatment time usually is between 30 minutes and 12 hours.

EXAMPLES

All tests were performed according to IPC™ 650.
The IPC test methods are the electrical laminate industry standard (The Institute For Interconnection and Packaging Electronic Circuits, 3451 Church Street, Evanston, Ill. 60203) as follows:

| Method | IPC-Test Method Number: |
|---|---|
| Reactivity (varnish) | IPC-TM-650-5.410 |
| Rest Gel time at 170° C., seconds | IPC-TM-650-2.3.18 |
| Mil Flow, weight percent | IPC-TM-650-2.3.17 |
| Glass Transition Temp., $T_g$ [° C.] | IPC-TM-650-2.4.25 |
| Copper Peel Strength | IPC-TM-650-2.4.8 |
| Pressure Cooker Test, weight percent water pick-up & percent passed solder bath at 260° C. | IPC-TM-650-2.6.16 |
| UL-94 Standard | IPC-TM-650-2.3.10 |

A) Preparation of Bisphenol-A-bisphenol-S Advancement Resin

A flask equipped with a stirrer, a reflux condenser, thermometer and solids addition funnel, is charged with 462 g of Bisphenol A epoxy resin (epoxy value=5.55 Eq/kg, MW: 340). After reaching 100° C. (inner temperature of the flask) 60 g of Bisphenol S is added. That reaction mixture is dissolved under stirring for 40 minutes until a temperature of 155° C. to 160° C. is reached.

After that time 78 g of Bisphenol S is added. At 155° C. to 160° C. the reaction mixture is maintained under stirring until after 4 hours an epoxy value of 1.94 Eq/kg (2.43 theoretical epoxy value) is reached.

The reaction mixture is cooled and subsequent blended with methylethylketone to a solid content of 70%.

The resin showed a viscosity at 25° C. of 2358 mPas and an epoxy value of 1.92. Eq/kg B) Laminates Benzoxazine fiberglass laminate composites are made by the solvent impregnating process.

TABLE 1

|  | 1 | 2 (comparison) |
|---|---|---|
| a) Benzoxazine resin* | 40.85% | 40,85% |
| b) B-S epoxy | 26.92%** |  |
| b) Epoxynovolac resin*** |  | 26.92% |
| c) Ferrocene | 2.15% | 2.15% |
| e) Methylethylketone | 30.08% | 30.08% |
| d) Aluminium trihydrate | 35% | 35% |
| Flammability | 94-V0 | 94-V1 |

*Bisphenol F benzoxazine
**Advancement resin according to Example A
***Semi-solid Epoxynovolac resin with the following properties: Epoxy value, Eq/kg 5,5-5,7, viscosity at 52° C. 20000-50000 mPas.
0.04% of 2-methylimidazol based on the sum of components a), b), c) and d) is added to control the varnish gel time to 200 to 250 s.

The laminate according to the instant invention (bold) meets the V0 criterion whereas an Epoxynovolac resin laminate (replacing the advancement resin according to the instant invention with an Epoxynovolac resin) failed.

By using composition 1 according to Table 1, 5 plies and 8 plies of glass fabrics (7628; an industry standard fiberglass weave type as defined by the glass strands, thickness and weight of the glass weave (Porcher SA; with a silane finish)) are impregnated. 5 and 8 plies of those impregnated fabrics are unidirectional staggered and treated under the following conditions:

TABLE 2

| Treating Temperature | 160-180° C. |
|---|---|
| Treating Time | 2'00"-4'00" |
| Glass fabric | 7628 |
| Resin content | 43-45% |
| Gel time at 171° C. | 80-100 sec |

The prepreg with copper is then laminated under heat and pressure to produce a copper clad laminate under the following conditions:

| Laminating conditions: | |
|---|---|
| Temperature | 190-200° C. |
| Hold time | >60 min |

Under the given press temperatures for the laminates the following glass transition temperatures for the laminates result:

TABLE 3

|  | Lamination condition | | |
|---|---|---|---|
|  | 180° C./60 min | 190° C./60 min | 200° C./60 min |
| 39 mil laminate Tg by DSC (° C.) | 147 | 155 | 157 |

These laminates are then evaluated for their thermal and electrical properties (Table 4).

TABLE 4

|  | Standard/ Test method |  | Composition 1 |
|---|---|---|---|
| Glass transition temperature | IPC-TM-650 2.4.24/2.4.25 | [° C.] | 150-155 |
| Laminate T 260* | IPC-TM-650 2.4.24.1 | [min] | >15 |
| Copper Peel strength* | IEC 249 | [N/mm] | 1.1-1.4 |
| PCT 120° C./1 h Vapor// @ 288° C./20 s** | Huntsman*** |  | pass |
| Water absorption/PCT 120° C./6 h/vapor** | Huntsman | [%] | 0.3 |
| Laminate Solder dip at 288° C./20 s* | TM-650 |  | Pass |
| Flammability** | UL 94 |  | V0 |
| Thermal Decomposition T/° C. | TGA |  | 335 |
| CTE α1 | TMA | [ppm/° C.] | 30-50 |
| CTE α2 | TMA | [ppm/° C.] | 180-200 |
| Dielectric at 1 MHz constant at 1 GHz | IEC249 |  | 5.1 / 4.9 |
| Loss Tangent at 1 MHz at 1 GHz | IEC249 |  | 0.009 / 0.012 |
| Volume Resistance ( ) | IEC249 | Ωcm | $>10^{12}$ |
| Surface Resistance (Ω) | IEC249 | Ω | $\geq 10^{10}$ |

*39 mil laminate w/Cu foil (5 ply);
**62 mil w/o Cu foil (8 ply):
***According to TM-650 but with a solder temperature of 288° C. (instead of 260° C.)
CTE α1: Z-axis coefficient of thermal expansion before laminate Tg
CTE α2: Z-axis coefficient of thermal expansion after laminate Tg

The invention claimed is:
1. A composition comprising
a) a benzoxazine resin and
b) an advancement resin based on bisphenol A diglycidyl ether and bisphenol S
and wherein component a) is a compound of formula (II)

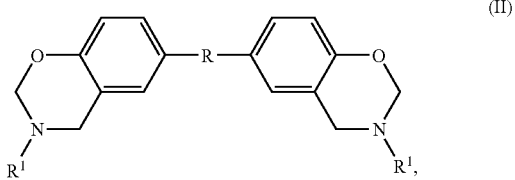

wherein R is $-SO_2-$, $-S-$, $-CH_2-$, $-C(CH_3)_2-$, a bond, dicyclopentadienyldiphenol, phenolphthalein or $-CH(CH_3)-$; and
$R^1$ is phenyl.

2. A composition according to claim 1, containing 55 to 65% by weight of component a) and 35 to 45% by weight of component b).

3. A composition according to claim 1 further comprising
c) ferrocene,
d) aluminium trihydrate and
e) optionally a solvent.

4. A composition according to claim 3 containing
35 to 42% by weight of component a), based on the sum of components a), b), c) and e);
23 to 30% by weight of component b), based on the sum of components a), b), c) and e);
1.8 to 2.3% by weight of ferrocene, based on the sum of components a), b), c) and e);
25 to 45% by weight of aluminium trihydrate based on the sum of components a), b), c), d) and e); and
25 to 35% by weight of a solvent based on the sum of components a), b), c) and e).

5. A composition according to claim 1 where component b) has an epoxy value of 1.5 to 2.5 Eq/kg.

6. A process for preparing a laminate comprising
(i) impregnating a substrate with a composition according to claim 1;
(ii) heating the substrate to form a sheet of prepreg;
(iii) stacking up one or more sheets of the prepreg in alternating layers with one or more sheets of conductive material;
(iv) pressing the stacked-up sheets at a temperature between 100° and 230° C. and a pressure between 50 N/cm² and 500 N/cm² to foam the laminate.
(v) optionally post-treating the laminate by heating at temperature between 120° and 250° C.

7. The process according to claim 6, wherein the sheet of conductive material is copper foil.

8. The process according to claim 7, wherein the substrate is fiberglass.

* * * * *